United States Patent
Moon et al.

(10) Patent No.: US 7,859,035 B2
(45) Date of Patent: Dec. 28, 2010

(54) STORAGE NODE HAVING A METAL-INSULATOR-METAL STRUCTURE, NON-VOLATILE MEMORY DEVICE INCLUDING A STORAGE NODE HAVING A METAL-INSULATOR-METAL STRUCTURE AND METHOD OF OPERATING THE SAME

(75) Inventors: Chang-wook Moon, Seoul (KR); Sang-mock Lee, Yongin-si (KR); In-kyeong Yoo, Suwon-si (KR); Seung-woon Lee, Yongin-si (KR); El Mostafa Bourim, Yongin-si (KR); Eun-hong Lee, Anyang-si (KR); Choong-rae Cho, Gimhae-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 115 days.

(21) Appl. No.: 11/606,889

(22) Filed: Dec. 1, 2006

(65) Prior Publication Data
US 2007/0126043 A1 Jun. 7, 2007

(30) Foreign Application Priority Data
Dec. 2, 2005 (KR) .................. 10-2005-0117225

(51) Int. Cl.
H01L 27/108 (2006.01)
H01L 29/94 (2006.01)
(52) U.S. Cl. .................................. 257/296; 257/298

(58) Field of Classification Search ............... 257/296, 257/298
See application file for complete search history.

(56) References Cited

U.S. PATENT DOCUMENTS

| | | | | |
|---|---|---|---|---|
| 5,926,360 | A | * | 7/1999 | Laibowitz et al. ........ 361/321.4 |
| 6,911,373 | B2 | * | 6/2005 | Kellar et al. .................. 438/399 |
| 2003/0100189 | A1 | * | 5/2003 | Lee et al. ...................... 438/694 |
| 2006/0138510 | A1 | * | 6/2006 | Fazan et al. .................. 257/296 |
| 2007/0242202 | A1 | * | 10/2007 | Kawase ....................... 349/139 |

OTHER PUBLICATIONS

Chinese Office Action of Jun. 5, 2009, and English translation thereof.

* cited by examiner

*Primary Examiner*—Phat X Cao
(74) *Attorney, Agent, or Firm*—Harness, Dickey & Pierce, P.L.C.

(57) ABSTRACT

A storage node having a metal-insulator-metal structure, a non-volatile memory device including a storage node having a metal-insulator-metal (MIM) structure and a method of operating the same are provided. The memory device may include a switching element and a storage node connected to the switching element. The storage node may include a first metal layer, a first insulating layer and a second metal layer, sequentially stacked, and a nano-structure layer. The storage node may further include a second insulating layer and a third metal layer. The nano-structure layer, which is used as a carbon nano-structure layer, may include at least one fullerene layer.

15 Claims, 3 Drawing Sheets

STORAGE NODE HAVING A METAL-INSULATOR-METAL STRUCTURE, NON-VOLATILE MEMORY DEVICE INCLUDING A STORAGE NODE HAVING A METAL-INSULATOR-METAL STRUCTURE AND METHOD OF OPERATING THE SAME

PRIORITY STATEMENT

This application claims the benefit of priority under 35 U.S.C. §119 from Korean Patent Application No. 10-2005-0117225, filed on Dec. 2, 2005 in the Korean Intellectual Property Office, the disclosure of which is incorporated herein in its entirety by reference.

BACKGROUND

1. Field of the Invention

Example embodiments relate to a storage node having a metal-insulator-metal structure, a non-volatile memory device including a storage node having a metal-insulator-metal structure and a method of operating the same.

2. Description of the Related Art

As semiconductor device fabrication process technologies develop, the width of a circuit line becomes narrower. For example, the width of the circuit line may decrease from a micron unit to a nano unit. The decrease in the width of the circuit line may be related to an increase in the integration density of a semiconductor device.

If the width of the circuit line is on the micron unit level, then a storage node of a memory device may have a metal-insulator-silicone (MIS) layer structure (hereinafter 'MIS structure'). If the width of the circuit line is on the nano unit level as a result of performing a nano process during the fabrication process, then it may be difficult for the storage node of the memory device to have the MIS structure.

If the storage node of the memory device is formed having the MIS structure as a result of the nano process, then a silicone layer of the MIS structure may break down (or be damaged). As such, the memory device may not properly operate.

In the fabrication process using the nano process, the storage node of the memory device may be formed to have a metal-insulator-metal (MIM) structure (hereinafter 'MIM structure'). In the case of a conventional memory device including the storage node having the MIM structure, a resistance deviation of the memory device may be greater and/or an upper metal layer may be more easily damaged.

SUMMARY

Example embodiments relate to a storage node having a metal-insulator-metal structure, a non-volatile memory device including a storage node having a metal-insulator-metal structure and a method of operating the same.

Example embodiments relate to a non-volatile memory device capable of preventing (or reducing) damage of an upper metal layer in a metal-insulator-metal (MIM) structure and a method of operating the same.

According to example embodiments, there is provided a memory device including a switching element and a storage node connected to the switching device. The storage node may include a first metal layer, a first insulating layer and a second metal layer, sequentially stacked. The storage node may also include a first nano-structure layer.

The first nano-structure layer may be formed on the second metal layer. The first nano-structure layer may be formed between the first insulating layer and the second metal layer.

The memory device may include a second nano-structure layer. If the first nano-structure layer is formed between the first insulating layer and the second metal layer, then the second nano-structure layer may be formed on the second metal layer.

In example embodiments, at least one of the first and second nano-structure layers may be a fullerene layer. The other nano-structure layer may be a non-fullerene layer.

A second insulating layer and a third metal layer may be sequentially stacked on the second metal layer. If the second insulating layer and the third metal layer are sequentially stacked on the second metal layer, then the first nano-structure layer may be formed on the third metal layer.

In other example embodiments, the first nano-structure layer may be formed between the second metal layer and the second insulating layer, and the second nano-structure layer may be formed on the third metal layer. At least one of the first and second nano-structure layers may be a fullerene layer. The other nano-structure layer may be a non-fullerene layer.

The nano-structure layers may be carbon nano-structure layers. The carbon nano-structure layers may be fullerene layers.

The first insulating layer may be one selected from the group consisting of an aluminum oxide ($Al_2O_3$) layer, a nickel oxide (NiO) layer, a zirconium oxide ($ZrO_2$) layer, a zinc oxide (ZnO) layer and a titanium oxide ($TiO_2$) layer.

At least one of the metal layers may be one selected from the group consisting of a gold layer, a copper layer, an aluminum layer, a niobium layer, a silver layer, a tungsten layer, a cobalt layer and a nickel layer.

According to other example embodiments, there is provided a method of operating a memory device including a switching element and a storage node connected thereto. The storage node may include a first metal layer, a first insulating layer and a second metal layer, sequentially stacked. The storage node may also include a nano-structure layer. The memory device may be operated by maintaining a channel of the switching element in an 'ON' state and applying a voltage to the storage node.

The voltage may be a set voltage or a reset voltage for recording a data bit. The voltage may be a read voltage for reading a data bit from the storage node.

Before applying the voltage, a data state recorded in the storage node may be checked.

The voltage may be an erase voltage for erasing a data bit in the storage node.

The method may include measuring a current flowing through the storage node while applying the read voltage and comparing the measured current with a reference current.

BRIEF DESCRIPTION OF THE DRAWINGS

Example embodiments will be more clearly understood from the following detailed description taken in conjunction with the accompanying drawings.

FIG. 1 is a diagram illustrating a sectional view of a non-volatile memory device including a storage node having a metal-insulator-metal (MIM) structure according to example embodiments;

FIGS. 2 through 5 are diagrams illustrating sectional views of a storage node according to example embodiments; and FIG. 6 is a graph illustrating operational characteristics of the non-volatile memory device shown in FIGS. 1 through 5.

DETAILED DESCRIPTION OF EXAMPLE EMBODIMENTS

Figure 1:
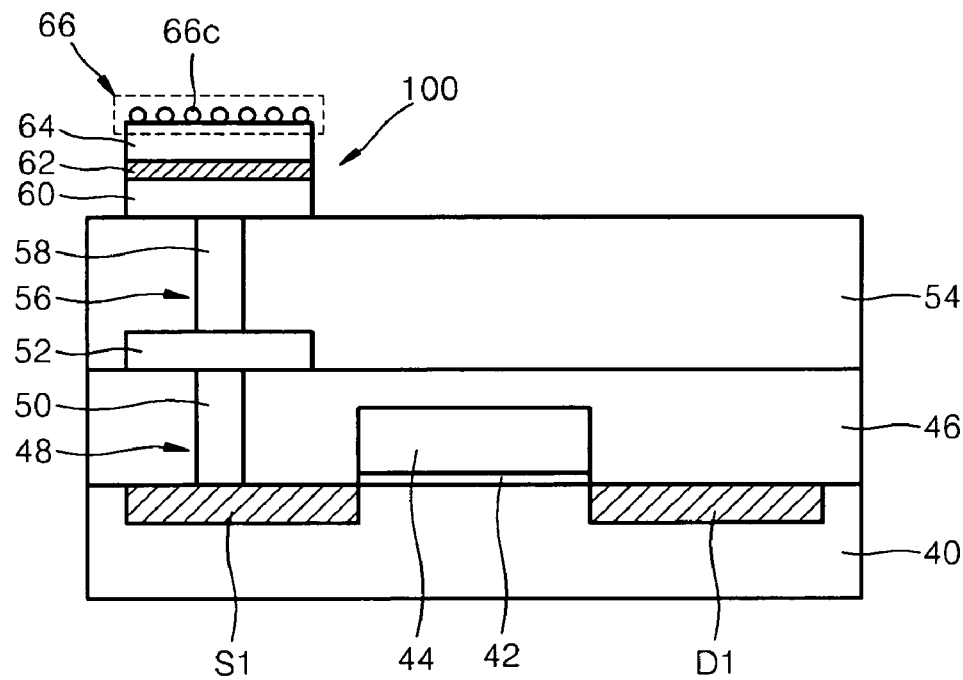
FIGS. 1-6 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only the example embodiments set forth herein.

Accordingly, while the example embodiments are capable of various modifications and alternative forms, embodiments thereof are shown by way of example in the drawings and will herein be described in detail. It should be understood, however, that there is no intent to limit example embodiments to the particular forms disclosed, but on the contrary, the example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of the example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to the example embodiments described.

Hereinafter, a storage node having a metal-insulator-metal structure, a non-volatile memory device including a storage node having a metal-insulator-metal (MIM) structure (hereinafter 'MIM memory device') according to example embodiments and a method of operating the same will now be described more fully with reference to the accompanying drawings, in which example embodiments are shown.

Now, a storage node and an MIM memory device including a storage node according to example embodiments will be explained.

FIG. 1 is a diagram illustrating a sectional view of a non-volatile memory device including a storage node having a metal-insulator-metal (MIM) structure.

Referring to FIG. 1, a first impurity region S1 and a second impurity region D1 may be separately formed in a substrate 40 apart from each other. The first and second impurity regions S1 and D1 may be doped with conductive impurities (e.g., n-type impurities). The substrate 40 may be a p-type silicon substrate. The substrate 40 may be any substrate which is widely used in the fabrication of memory devices. The first and second impurity regions S1 and D1 may have various shapes. For example, the first and second impurity regions S1 and D1 may have a lightly doped drain (LDD) structure. One of the first and second impurity regions S1 and D1 may be a source region and the other region may be a drain region.

A gate oxide layer 42 and a gate 44 may be sequentially stacked on the substrate 40 between the first and second impurity regions S1 and D1. The substrate 40, the first impurity region (S1), the second impurity region D1 and the gate 44 form a transistor or similar switching element. The transistor may be replaced with a PN junction diode.

A first insulating interlayer 46 covering the transistor may be formed on the substrate 40. A first contact hole 48 may be formed in the first insulating interlayer 46 to expose the first impurity region S1. The first contact hole 48 may be formed at the position exposing the second impurity region D1 instead of the first impurity region S1. The first contact hole 48 may be filled with a first conductive plug 50.

A pad layer 52 may be formed on the first insulating interlayer 46 to cover the exposed portion of the first conductive plug 50. The pad layer 52 may be formed to more sufficiently secure a subsequent contact margin. The pad layer 52 may be a conductive material layer.

A second insulating interlayer 54 covering the pad layer 52 may be formed on the first insulating interlayer 46. A second contact hole 56 exposing the pad layer 52 may be formed in the second insulating interlayer 54. The second insulating interlayer 54 may be formed of the same insulating layer as the first insulating interlayer 46. The second contact hole 56 may be filled with a second conductive plug 58. The first and second conductive plugs 50 and 58 may be doped polysilicon plugs.

A storage node 100 having an MIM structure may be formed on the second insulating interlayer 54 to cover the exposed portion of the second conductive plug 58.

A first metal layer 60 of the storage node 100 may be formed on the second insulating interlayer 54. The first metal layer 60 may cover the exposed portion of the second conductive plug 58. The first metal layer 60 may be a layer formed of a metal having a low work function. For example, the first metal layer 60 may be a layer formed of gold (Au). The first metal layer 60 may be formed of a metal other than gold (e.g., a copper (Cu) layer, an aluminum (Al) layer, a niobium (Nb) layer, a silver (Ag) layer, a tungsten (W) layer, a cobalt (Co) layer, a nickel (Ni) layer or the like).

A first insulating layer 62 of the storage node 100 may be formed on an upper surface of the first metal layer 60. The first insulating layer 62 may be an aluminum oxide (also known as alumina) layer (e.g., $Al_2O_3$ layer). The first insulating layer 62 may be an insulating layer formed of an insulating material other than aluminum oxide (e.g., a nickel oxide (NiO) layer, a zirconium oxide ($ZrO_2$) layer, a zinc oxide (ZnO) layer or a titanium oxide ($TiO_2$) layer). If the first insulating layer 62 is an alumina layer, then a thickness of the first insulating layer 62 may be 5 to 10 nm. The thickness of the first insulating layer 62 may vary depending on the insulating material used.

A second metal layer 64 and a first fullerene layer 66 may be sequentially stacked on the first insulating layer 62 in the storage node 100. The second metal layer 64 may be formed of the same metal as the first metal layer 60.

The first fullerene layer 66 may be a carbon nano-structure layer. Another carbon nano-structure layer or a nano-structure layer may be used as the first fullerene layer 66. The first fullerene layer 66 may be a layer coated with desired fullerene molecules 66c. The fullerene molecules 66c may be $C_{60}$ or other fullerene molecules (e.g., $C_{70}$, $C_{72}$, $C_{74}$, $C_{76}$, $C_{82}$, $C_{84}$, $C_{86}$, $C_{116}$ or the like).

FIGS. 2 through 5 are diagrams illustrating sectional views of a storage node according to example embodiments.

Figure 2:
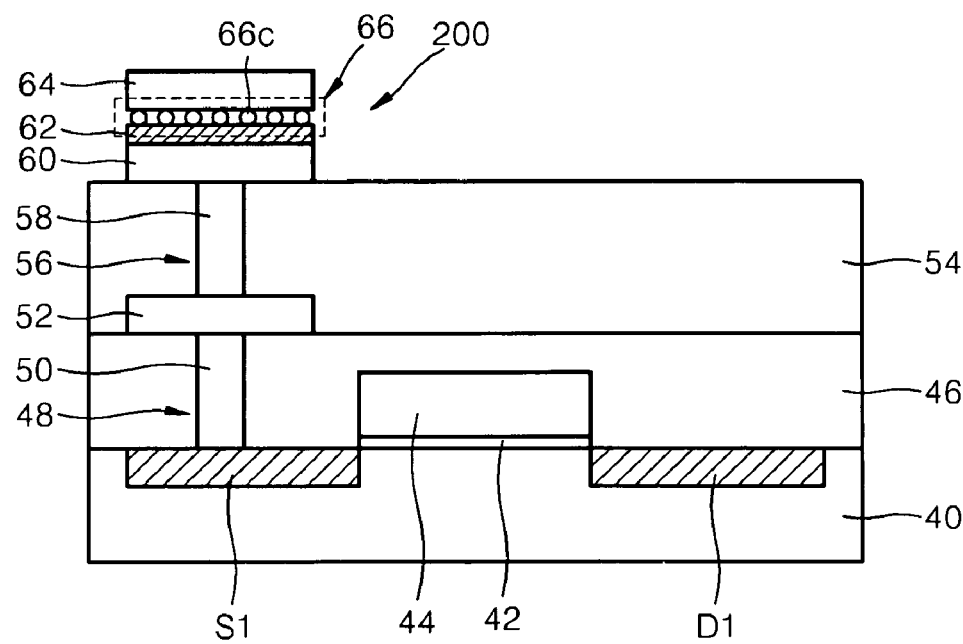

FIG. 2 is a diagram illustrating storage node 200 according to example embodiments. Storage node 200 may have elements similar to storage node 100. Therefore, a description of like elements will be omitted for the sake of brevity.

Referring to FIG. 2, in the storage node 200, the first fullerene layer 66 may be formed between the first insulating layer 62 and the second metal layer 64.

Figure 3:
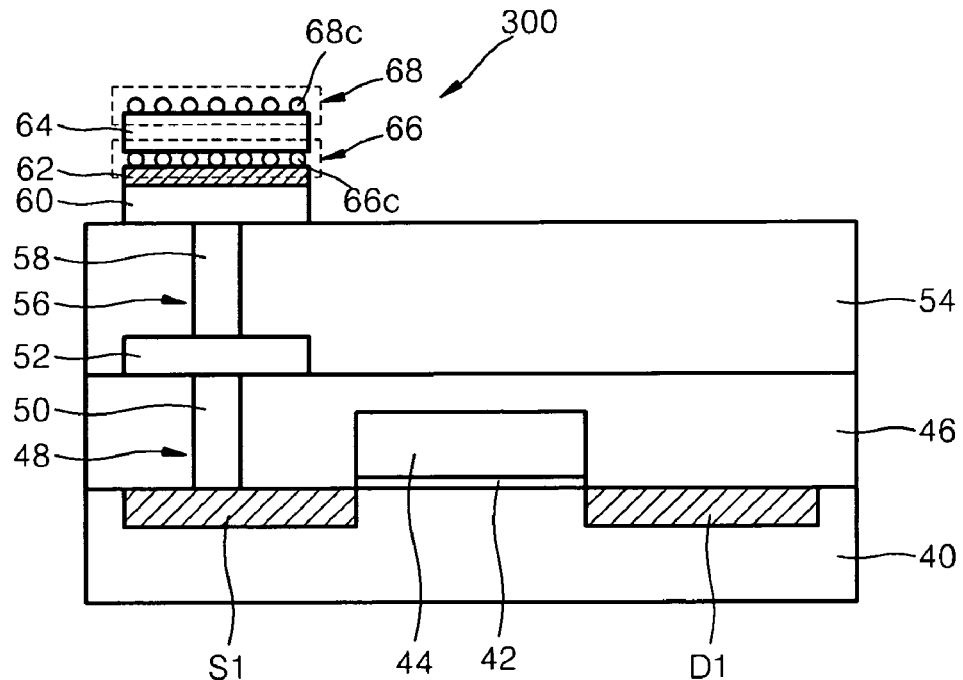

FIG. 3 is a diagram illustrating storage node 300 according to example embodiments. Storage node 300 may have elements similar to storage nodes 100 and 200. Therefore, a description of like elements will be omitted for the sake of brevity.

Referring to FIG. 3, the storage node 300 may have a second fullerene layer 68 on the second metal layer 64. The second fullerene layer 68 may be a layer coated with desired fullerene molecules 68c. The fullerene molecules 68c may be the same molecules as the fullerene molecules 66c of the first fullerene layer 66.

In other example embodiments, the fullerene molecules 66c and 68c of the first and second fullerene layers 66 and 68 may be different from each other. For example, the fullerene molecules 66c of the first fullerene layer 66 may be $C_{70}$ and the fullerene molecules 68c of the second fullerene layer 68 may be $C_{60}$. The first and/or second fullerene layers 66 and 68 may be a carbon nano-structure layer excluding fullerene molecules.

Figure 4:
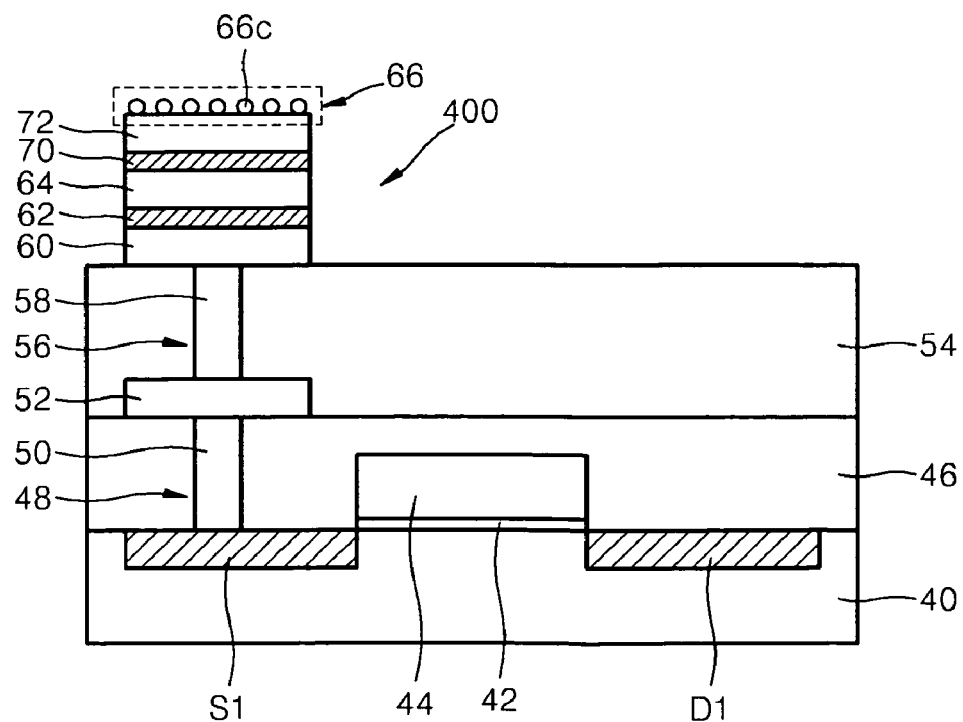

FIG. 4 is a diagram illustrating a storage node 400 according to example embodiments.

Referring to FIG. 4, the storage node 400 may include a second insulating layer 70 and a third metal layer 72, which are sequentially stacked on a second metal layer 64. The storage node 400 may include a first fullerene layer 66 on the third metal layer 72. A second insulating layer 70 may be formed of the same insulating material as a first insulating layer 62. In other example embodiments, the second insulating layer 70 may be formed of a different insulating material than the first insulating layer 62. The third metal layer 72 may be formed of the same material layer as a first metal layer 60 and a second metal layer 64. The third metal layer 72 may be formed of the same or different material as the first metal layer 60 or the second metal layer 64. The first, second and/or third metal layer 60, 64 and 72 may have a low work function.

Figure 5:
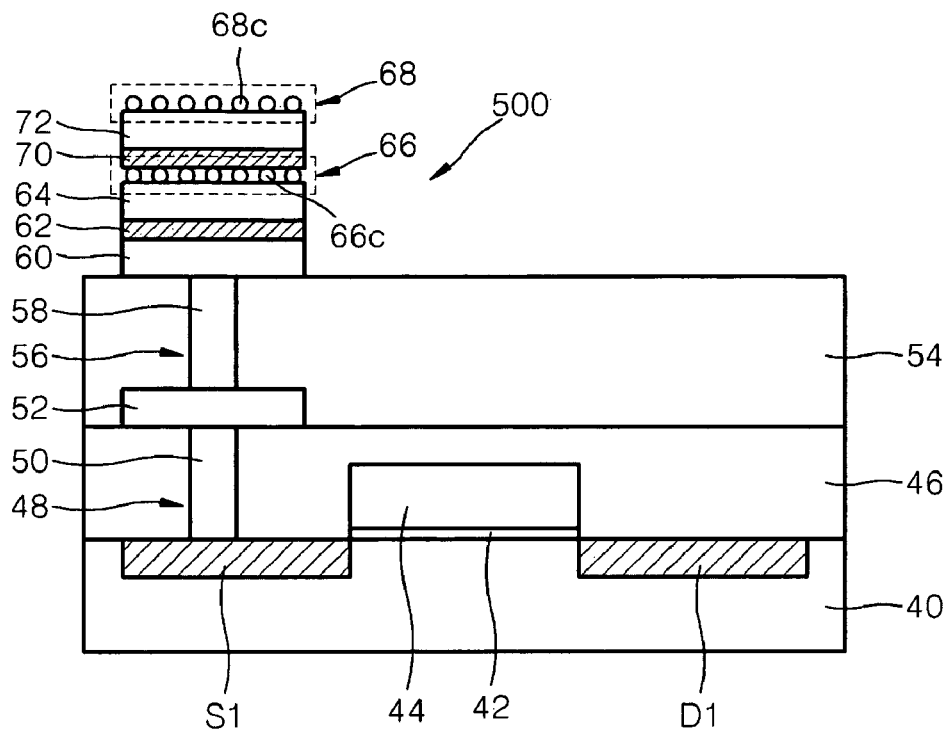

FIG. 5 is a diagram illustrating storage node 500 according to example embodiments. Storage node 500 may have elements similar to storage node 400. Therefore, a description of like elements will be omitted for the sake of brevity.

Referring to FIG. 5, the first fullerene layer 66 may be formed between the second metal layer 64 and the second insulating layer 70.

In other example embodiments, a second fullerene layer 68 may be formed on the third metal layer 72.

In fabricating the MIM memory devices illustrated in FIGS. 1 through 5, material layers forming the storage node may be sequentially stacked on the second insulating interlayer 54. A photoresitive layer pattern defining a storage node region may be formed on the stacked material layers. The stacked material layers may be removed using the photosensitive layer pattern as an etch mask.

Operational characteristics of the MIM memory device according to example embodiments will now be explained.

Figure 6:
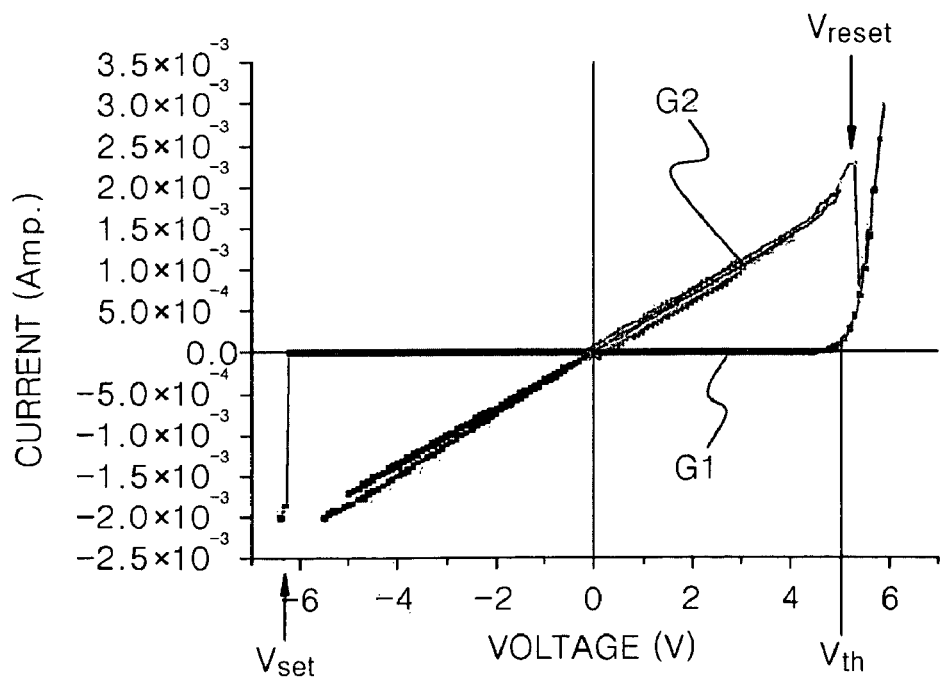

FIG. 6 is a graph illustrating operational characteristics of a non-volatile memory device according to example embodiments.

Referring to FIG. 6, a first plot G1 shows the current in relation with an initially-applied voltage (hereinafter 'initial voltage') of a MIM memory device without any recorded data. A second plot G2 shows the current in relation with a voltage applied to the MIM memory device after the initial voltage is applied to the MIM memory device. The MIM memory device discussed in connection with the second plot G2 will hereinafter be referred to as an 'active memory device.'

Referring to the first plot G1 of FIG. 6, if the initial voltage is a positive voltage, then the MIM memory device may maintain a high resistance state until the initial voltage reaches a threshold voltage ($V_{TH}$) (e.g., +5 V). If the initial voltage is greater than the threshold voltage, then a current of the MIM memory device may increase exponentially. As such, a resistance of the MIM memory device may rapidly decrease if the initial voltage is greater than the threshold voltage. The characteristics of the MIM memory device may be similar to a diode.

If a negative initial voltage is applied to the MIM memory device (after the positive initial voltage is applied), then electrons accumulated in an upper electrode (the second metal layer 64) as a result of applying positive initial voltage may move to a lower electrode (the first metal layer 60). A resistance of the MIM memory device may maintain a relatively higher resistance state until the negative initial voltage reaches a set voltage ($V_S$) (e.g., −6 V). If the negative initial voltage is lower than the set voltage ($V_S$) (e.g., −6 V or greater than 6 V as an absolute value), then the current of the MIM memory device may rapidly increase.

Characteristics of the MIM memory device may be similar to characteristics of a reverse bias applied to a diode.

As described above, because a current path may be formed in the first insulating layer 62 and the second insulating layer 70 of the MIM memory device when the initial voltage is applied, the first and second insulating layers 62 and 70 may have properties similar to a conductor as a result of electrons trapped in the fullerene molecules 66 and 68 when the initial voltage is applied.

Referring to the second plot G2 of FIG. 6, the active memory device may have a constant current at a given negative voltage. If the given negative voltage is lower than an absolute value of the negative initial voltage, then resistance rapidly decreases. The active memory device may have a constant current at a given positive voltage. If the given positive voltage is increases and reaches a predetermined voltage, then the current may rapidly decrease.

According to example embodiments, the resistance of the active memory device may rapidly increase as a result of cutting the current path formed in the first and second insulating layers 62 and 70 of the active memory device, which is formed during the initial voltage sweep process. If the given positive voltage is increases and reaches the specific voltage or higher, then the current measured from the active memory device may increase exponentially.

If the specific voltage is applied to the active memory device, then the current-voltage characteristics of the active memory device may be similar to the characteristics of the first plot G1. As such, the active memory device returns to a desired state before the initial voltage sweep process at the specific voltage. The specific voltage is referred to as a reset voltage ($V_{RESET}$).

Assuming that the active memory device is in a state that a data bit 1 is recorded, then the reset voltage may be a voltage inactivating the active memory device (e.g., a voltage erasing the data bit 1 in the active memory device).

The first plot G1 and the second plot and G2 of FIG. 6 show results of at least two measurements. The first plot G1 and the second plot G2 have concurring results. As such, a current (or resistance) deviation of the MIM memory device may be substantially smaller (or narrower). The smaller (or narrower) resistance deviation means that the MIM memory device may be desirable because the resistance values (measured numerous times) are similar at a given voltage.

Now, a method of operating the MIM memory device according to example embodiments will be explained in reference to the operation characteristics.

In the following discussion, if the MIM memory device has the same current-voltage characteristics as the first plot G1 of FIG. 6, then it is assumed that data bit 0 is recorded in the MIM memory device. If the MIM memory device has the same current-voltage characteristics as the second plot G2 of FIG. 6 (the active memory device), then it is assumed that data bit 1 is recorded in the MIM memory device.

The following operating method will be based on the above conditions. However, the example embodiments are not limited thereto.

Write Operation

A channel of the switching element may be maintained in an "ON" state during an operation mode.

A write operation for writing data bit 0 may vary depending on the state of the MIM memory device. If the state of the MIM memory device follows the first plot G1, then an additional operation for writing data bit 0 to the MIM memory device may not be necessary. If the state of the MIM memory device follows the second plot G2, then a voltage equal to or higher than the reset voltage may be applied to the MIM memory device as a write voltage ($V_w$) for writing data bit 0.

In order to apply the write operation, a read operation for confirming a state of the MIM memory device must precede the write operation.

If the confirmation process is omitted (or cannot be found), then the reset voltage (at least) is applied as a write voltage ($V_w$) in order to record data bit 0 to the MIM memory device.

If the state of the MIM memory device follows the first plot G1 when data bit 1 is written to the MIM memory device, then a voltage equal to the threshold voltage ($V_{th}$) or higher (or the set voltage) may be applied to the MIM memory device.

Because data bit 1 is recorded in the MIM memory device, if the state of the MIM memory device follows the second plot G2, then an additional operation for writing data bit 1 may not be necessary.

If the state of the MIM memory device cannot be found or the confirmation process of the state of the MIM memory device is omitted (in the same manner that data bit 0 is recorded), then it is assumed that the state of the MIM memory device follows the first plot G1 and the set voltage is applied to the MIM memory device to write data bit 1 to the MIM memory device.

If it is assumed that the state of the MIM memory device follows the first plot G1 and data bit 1 is written to the MIM memory device, then a voltage of the threshold voltage ($V_{th}$)

or higher may be applied to the MIM memory device. If the state of the MIM memory device follows the second plot G2, then an operation (for applying a voltage equal to the threshold voltage or higher to the MIM memory device) may be an erase operation for erasing data bit 1 in the MIM memory device. If the state of the MIM memory device is not checked during the operation for recording data bit 1, then the set voltage may be applied to the MIM memory device in order to record data bit 1.

Read Operation

Comparing the first plot G1 and the second plot G2, the MIM memory device may have two different current values. For example, the MIM memory device may have two different resistance values at a predetermined voltage lower than a threshold voltage ($V_{TH}$). The MIM memory device may have a predetermined voltage higher than a set voltage (the absolute value of the voltage is smaller than the set voltage ($V_S$)). A predetermined voltage lower than a threshold voltage $V_{th}$ (e.g., 5 V when the first insulating layer 62 or the second insulating layer 70 are formed of alumina ($Al_2O_3$)) and higher than 0 V may be applied to the MIM memory device to measure the current from the MIM memory device. The measured current (or resistance) may be compared to a reference current (or resistance).

As a comparison, when the MIM memory device is in a state similar to second plot G2, if the measured current is greater than the reference current, then it may be assumed that data bit 1 is read from the MIM memory device. If the measured current is smaller than the reference current, then it may be assumed that data bit 0 is read from the MIM memory device.

Erase Operation

An erase operation may be performed by applying the reset voltage to the MIM memory device.

As described above, the MIM memory device has a fullerene layer having a higher tensile strength on at least an upper metal layer of a storage node (the second metal layer 64 of FIGS. 1-3 or the third metal layer 72 of FIGS. 4 and 5).

As such, damage of the upper metal layer may be reduced during the operation process of a memory device and/or a resistance deviation may be smaller, increasing reproducibility.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. For example, widths of the component elements of the storage node illustrated in FIGS. 1-5 may be formed as a taper shape. A separate spacer may be formed on the sidewalls of the storage node. The second conductive plug 58 may be formed to directly contact the first impurity region S1. One of the first and second fullerene layers 66 and 68 (used as the carbon nano-structure layer) may be replaced with a different carbon nano-structure layer (e.g., carbon nano-tube, carbon nano-wire, carbon nano-fiber or the like).

Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A storage node, comprising:
a first metal layer; a first insulating layer; a second metal layer; and a first nano-structure layer, sequentially stacked,
the first nano-structure layer being formed on an upper surface of the second metal layer, wherein the first metal layer is a lower electrode, the second metal layer is an upper electrode, and the first nano-structure layer is a carbon nano-structure layer.

2. The storage node of claim 1, further comprising a second nano-structure layer between the first insulating layer and the second metal layer.

3. The storage node of claim 1, wherein the first nano-structure layer is a fullerene layer and the second nano-structure layer is a non-fullerene layer.

4. The storage node of claim 1, wherein the first nano-structure layer is a non-fullerene layer and the second nano-structure layer is a fullerene layer.

5. The storage node of claim 1, further comprising a third metal layer and a second insulating layer sequentially stacked between the first insulating layer and the second metal layer.

6. The storage node of claim 5, further comprising a second nano-structure layer between the third metal layer and the second insulating layer.

7. The storage node of claim 6, wherein the first nano-structure layer is a fullerene layer and the second nano-structure layer is a non-fullerene layer.

8. The storage node of claim 6, wherein the first nano-structure layer is a non-fullerene layer and the second nano-structure layer is a fullerene layer.

9. The storage node of claim 1, wherein the first insulating layer is selected from the group consisting of an aluminum oxide ($Al_2O_3$) layer, a nickel oxide (NiO) layer, a zirconium oxide ($ZrO_2$) layer, a zinc oxide (ZnO) layer and a titanium oxide ($TiO_2$) layer.

10. The storage node of claim 1, wherein the carbon nano-structure layer is a fullerene layer.

11. The storage node of claim 1, wherein at least one of the first and second metal layers is selected from the group consisting of a gold layer, a copper layer, an aluminum layer, a niobium layer, a silver layer, a tungsten layer, a cobalt layer and a nickel layer.

12. The storage node of claim 2, wherein the second nano-structure layer is a carbon nano-structure layer.

13. The storage node of claim 6, wherein the second nano-structure layer is a carbon nano-structure layer.

14. The storage node of claim 5, wherein the first insulating layer is selected from the group consisting of an aluminum oxide ($Al_2O_3$) layer, a nickel oxide (NiO) layer, a zirconium oxide ($ZrO_2$) layer, a zinc oxide (ZnO) layer and a titanium oxide ($TiO_2$) layer.

15. A semiconductor memory device, comprising:
a switching element; and
the storage node according to claim 1, connected to the switching element.

* * * * *